United States Patent [19]

Ning et al.

[11] Patent Number: 5,231,299
[45] Date of Patent: Jul. 27, 1993

[54] STRUCTURE AND FABRICATION METHOD FOR EEPROM MEMORY CELL WITH SELECTIVE CHANNEL IMPLANTS

[75] Inventors: Tak H. Ning; Ching-Hsiang Hsu, both of Yorktown Heights, N.Y.

[73] Assignee: International Business Machines Corporation, Armonk, N.Y.

[21] Appl. No.: 857,020

[22] Filed: Mar. 24, 1992

[51] Int. Cl.$^5$ .................. H01L 29/68; H01L 21/265
[52] U.S. Cl. .................................. 257/316; 257/321; 257/322; 257/402; 257/404; 437/40; 437/45
[58] Field of Search .................. 357/23.5, 23.7, 23.9, 357/23.12, 89; 437/40, 45

[56] References Cited

U.S. PATENT DOCUMENTS 4,974,051  11/1990  Matloubian et al. ............. 357/23.7

*Primary Examiner*—Edward J. Wojciechowicz
*Attorney, Agent, or Firm*—John J. Goodwin

[57] ABSTRACT

An electrically programmable and electrically erasable memory cell (EEPROM) formed in a silicon body is described. The cell includes a silicon body or substrate with shallow trench isolation regions disposed therein. First and second spaced-apart source and drain regions of a first conductivity type are provided with a channel region in between. A first gate member, a floating gate, which is completely surrounded by insulation extends from at least the edge of the source region, over the channel region to at least the edge of the drain region. A second gate member, a control gate, includes a portion which extends over the floating gate. The control gate extends from at least the edge of the source region, over the channel region to at least the edge of the drain region. The channel region beneath the floating gate has both a highly doped portion and a lightly doped portion. The fabrication process of the EEPROM cell is also disclosed and includes the steps of low and high dose channel implantation, formation of the floating gate and control gate, and formation of the source and drain elements.

12 Claims, 2 Drawing Sheets

STRUCTURE AND FABRICATION METHOD FOR EEPROM MEMORY CELL WITH SELECTIVE CHANNEL IMPLANTS

BACKGROUND OF THE INVENTION

1. Field of the Invention

The present invention relates to the field of electrically programmable and electrically erasable memory cells, and particularly to such memory cells with floating gates and a region having channel implants.

2. Description of the Background Art

Conventionally, metal-oxide-semiconductor (MOS) technology has been used to fabricate electrically programmable read-only memories (EPROMs) that employ floating gates, wherein polysilicon floating-gate members are completely surrounded by an insulator. During programming, electrical charge is transferred into the floating gate through a variety of mechanisms such as avalanche injection, channel hot electron injection, Fowler-Nordheim tunnelling, hot electron injection from the substrate, etc. A variety of phenomena have been used to remove charge including exposing the memory to ultraviolet radiation. Commercial EPROMs with floating gates first used avalanche injection to charge the floating gate; in second generation memories channel hot electron injection is used for programming. These memories are erased by exposure to ultraviolet radiation.

Electrically erasable and programmable read-only memories (EEPROMs) generally use a thin oxide region to tunnel charge into and from a floating gate or channel hot electrons to inject charge into a floating gate and then tunneling to extract the charge out of the floating gate. In a typical memory, a two transistor cell is used. See, for instance, U.S. Pat. No. 4,203,158 for a discussion of such cells and U.S. Pat. No. 4,266,283 for a discussion of related circuitry.

Other background references known to applicants are as follows.

U.S. Pat. No. 4,403,307, issued Sep. 6, 1983 to Maeda entitled SEMICONDUCTOR MEMORY DEVICE, discloses a semiconductor memory device composed of double gate type field effect transistors which have control gate and floating gate for accumulating charges. The conditions for optimum charge injection writing and for optimum reading of this semiconductor memory device are mutually inconsistent. In order to satisfy said two conditions, the reference invention provides a charge injection transistor and a read transistor, wherein the floating gate of both transistors are electrically connected, the control gates are connected to a first signal line, the drains are connected respectively to the different second and third signal lines and the sources are grounded.

This reference uses two separate MOSFETs, one with a high doped channel and the other with a low doped channel connected together so that the two FETs share the same floating and control gate and the same source.

U.S. Pat. No. 4,949,140, issued Aug. 14, 1990 to Tam entitled EEPROM CELL WITH INTEGRAL SELECT TRANSISTOR and U.S. Pat. No. 4,814,286, issued Mar. 21, 1989 to Tam entitled EEPROM CELL WITH INTEGRAL SELECT TRANSISTOR, discloses an electrically programmable and electrically erasable floating gate memory device which includes an integrally formed select device. In the n-channel embodiment, a boron region is formed adjacent to the drain region under the control gate and extends slightly under the floating gate. This region is formed using a spacer defined with an anisotropic etching step. The region, in addition to providing enhanced programming, prevents conduction when over-erasing has occurred, that is, when the erasing causes the cell to be depletion-like.

U.S. Pat. No. 4,780,424, issued Oct. 25, 1988 to Holler et al entitled PROCESS FOR FABRICATING ELECTRICALLY ALTERABLE FLOATING GATE MEMORY DEVICES, discloses a process for fabricating contactless electrically programmable and electrically erasable memory cells of the flash EPROM type. The contactless cells use elongated source and drain regions disposed beneath field oxide regions. The drain regions are shallow compared to the source regions. The source regions have more graded junctions. Floating gates are formed over a tunnel oxide between the source and drain regions with word lines being disposed perpendicular to the source and drain regions. One dimension of the floating gates is formed after the word lines have been patterned by etching the first layer of polysilicon in alignment with the word lines.

U.S. Pat. No. 4,622,656, issued Nov. 11, 1986 to Kamiya et al entitled NON-VOLATILE SEMICONDUCTOR MEMORY, relates to the reduction of programming voltage in a non-volatile memory of the type having a double gate structure composed of a select-gate and a floating gate. A channel region under the select-gate is highly doped and a channel region under the floating gate is lightly doped or doped to opposite conductivity type. Due to the different doping concentrations between these two channel regions, a large and steep surface potential gap appears at the transition region between the select-gate and the floating-gate in the programming operation thereby reducing the programming voltage.

U.S. Pat. No. 4,515,849, issued May 28, 1985 to Korsh et al entitled METHOD OF MAKING EPROM CELL WITH REDUCED PROGRAMMING VOLTAGE, discloses an improved floating gate MOS ESPROM cell which is programmable at a lower potential (12 volts) than prior art devices which require 25 volts. The oxide thickness between the floating gate and overlying control gate is thicker at the edges of the floating gate than in the central portion. The thicker oxide at the edges prevents uncontrolled DC erasing. This allows a thinner oxide to be used in the central portion and provides the increased capacitance coupling needed for programming at a lower potential.

U.S. Pat. No. 4,361,847, issued Nov. 30, 1982 to Harari entitled NON-VOLATILE EPROM WITH ENHANCED DRAIN OVERLAP FOR INCREASED EFFICIENCY, discloses a structure wherein the floating gate in an N channel EPROM cell extends over the drain diffusion and over a portion of the channel thereby to form a "drain" capacitance between the drain and the floating gate and a "channel" capacitance between the channel and the floating gate. A control gate overlaps the floating gate and extends over the remainder of the channel near the source diffusion thereby to form a "control" capacitance between the channel and the control gate. These three capacitances form the coupling for driving each cell. The inversion region in the channel directly under the control gate is established directly by a "write or read access" voltage applied to the control gate. The inversion region in the channel directly under the floating gate is established indirectly through the drain and control capacitances and the channel capacitance by the control gate voltage and by another write access voltage applied to the drain.

U.S. Pat. No. 4,355,455, issued Oct. 26, 1982 to Boettcher entitled METHOD OF MANUFACTURE FOR SELF-ALIGNED FLOATING GATE MEMORY CELL, relates to a structure wherein a floating gate memory cell has its control gate self-aligned to the floating gate in the source to drain direction and its floating gate self-aligned to the channel region in that direction and the direction transverse thereto without overlaying the field oxide. The cell may be manufactured by the following method: forming insulation such as silicon oxide over the substrate to serve as gate oxide; forming a conductor such as polysilicon over the insulation; etching the polysilicon to a patterned mask and using the mask to dissolve the unprotected oxide to leave a future floating gate of polysilicon overlaying and coextensive with the future channel region in the direction transverse to the source-to-drain region; overlaying insulation such as a further oxide and then overlaying a second conductor such as polysilicon, which is thus insulated from the floating gate; patterning this second polysilicon, which will serve as a control gate, with a photoresist mask to etch the second conductor to form a control gate, and to preferentially remove enough oxide to expose the unmasked portion of the future floating gate, and etching this unmasked portion.

U.S. Pat. No. 4,141,926, issued Mar. 6, 1979 to Morgan entitled SELF-ALIGNING DOUBLE POLYCRYSTALLINE SILICON ETCHING PROCESS, discloses a process for fabricating a double layer polycrystalline silicon structure for a metal-oxide-semiconductor (MOS) integrated circuit. The upper polycrystalline silicon layer, after being etched to form a predetermined pattern, is used as a masking member for etching the lower polycrystalline silicon layer, thereby assuring alignment between the layers. A selective etchant which discriminates between the silicon layers is employed.

U.S. Pat. No. 4,016,588, issued Apr. 5, 1977 to Ohya et al entitled NON-VOLATILE SEMICONDUCTOR MEMORY DEVICE, describes a non-volatile semiconductor memory device that includes a gate insulating film which has a relatively thin portion in the vicinity of one of the source and drain regions at which p-n junction breakdown is performed for carrier injection.

Japanese Patent 1-30 2770, issued May 8, 1982 to Omatao entitled SEMICONDUCTOR DEVICE, discloses a structure that includes a P+ type impurity diffusion region as a second impurity region having the same conductivity type as a semiconductor substrate and the impurity concentration higher than that of the substrate formed, so as to neighbor to the side part covered with the first gate oxide film of of a drain region constituting an EPROM memory transistor. The impurity concentration gradient between the drain region and the diffusion region becomes large, and the junction breakdown strength is decreased. The avalanche phenomenon more liable to occur than conventional examples. The number of electrons generated by the avalanche phenomenon increases, and the energy becomes large. Thereby, sufficient electron injection is enabled.

Japanese Patent 57-73978, issued May 8, 1982 to Yamada entitled SEMICONDUCTOR DEVICE, relates to means to accelerate the responding speed of a semiconductor device having a floating gate by forming a diffuse layer of higher impurity density than a substrate and of the same conductive type as the substrate under a field oxidized film in contact with the drain of the element, thereby lowering the writing voltage.

Japanese Patent 52-28777, issued Mar. 3, 1977 to Iizuka entitled NON-VOLATILE SEMICONDUCTOR MEMORY DEVICE, describes means to lower the voltage of writing and shorter time of writing by forming a P+ layer contacted with a drain region on the channel region of P type substrate.

European Patent 0046886, issued Aug. 29, 1980 to Siemens, discloses dynamic RAM single transistor memory cells production, integrated in semiconductor chip by forming oxide structures, e.g., by Locos process.

Canadian Patent 1119-299, issued Feb. 5, 1979 to Chan et al, discloses an inverse floating gate semiconductor EPROM that has a heavily doped P-type region within channel regions underlying laterally extending part of floating gate to accelerate electrons.

The device has a p-type substrate, N-type source and drain regions formed in the substrate. A channel region extends between the source and the drain, and a selection gate and gate are stacked above the channel region. The gates are electrically insulated from one another and from the channel region by oxide layers, the floating gate having a first part overlying the selection gate and a second part projecting laterally beyond the selection gate. The selection gate extends closer to the channel region than the first part.

A heavily doped p-type region is provided within the channel region and underlying the second part of the floating gate. The heavily doped p-type region acts in operation of the device, to accelerate electrons along the channel region, the heavily doped p-type region vertically defined at one edge by the drain. The device is fabricated on a silicon substrate and has polysilicon gates. A matrix of leads is provided for selecting individual devices.

SUMMARY OF THE INVENTION

An object of the present invention is to provide an improved EEPROM memory cell structure having a selective channel implant in the channel width direction.

Another object of the present invention is to provide an improved EEPROM memory cell structure having a floating gate on a channel region with selective implant including a higher dose region and a lower dose region along the channel width direction.

A further object of the present invention is to provide an improved EEPROM memory cell structure including a source region and a drain region disposed in a substrate and separated by a channel region selectively implanted with high and low doped regions.

A yet further object of the present invention is to provide high speed channel hot electron programming from the high doped channel region of the EEPROM cell while maintaining high read current from the low doped channel region of the memory cell.

BRIEF DESCRIPTION OF THE DRAWINGS

FIG. 3 is the cross-section in the 3—3 direction of FIG. 5.

FIG. 4 is the cross-section in the 4—4 direction of FIG. 5, or cross-section 4'—4' of FIG. 3.

DESCRIPTION OF THE PREFERRED EMBODIMENT

An electrically programmable and electrically erasable memory cell (EEPROM) formed in a silicon body is described. The fabrication steps for forming the EEPROM are shown in FIGS. 1, 2, 3 and 4, with FIG. 4 illustrating the essential elements of the fabricated EEPROM cell.

Figure 4:
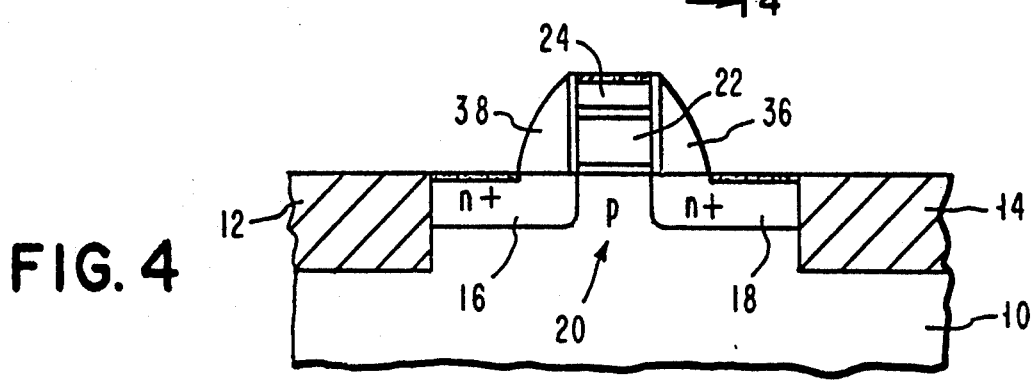

Referring to FIG. 4, the cell includes a silicon body or substrate 10 with shallow trench isolation regions 12 and 14. First and second spaced-apart regions 16 and 18 of a first conductivity type define a channel region 20. Regions 16 and 18 are the source and drain regions of the device. A first gate member, a floating gate 22, which is completely surrounded by insulation extends from at least the edge of the first region 16, over the channel region 20 to at least the edge of the second region 18.

A second gate member, a control gate 24, includes a portion which extends over the floating gate 22. The control gate 24 extends from at least the edge of the first region 16, over the channel to at least the edge of the second region 18.

An important feature of the present invention is that the channel region 20 beneath the floating gate 22 has a highly doped portion and a lightly doped portion. The formation of the channel region having selective implants is illustrated in the FIGS. 1, 2 and 3.

Figure 1:
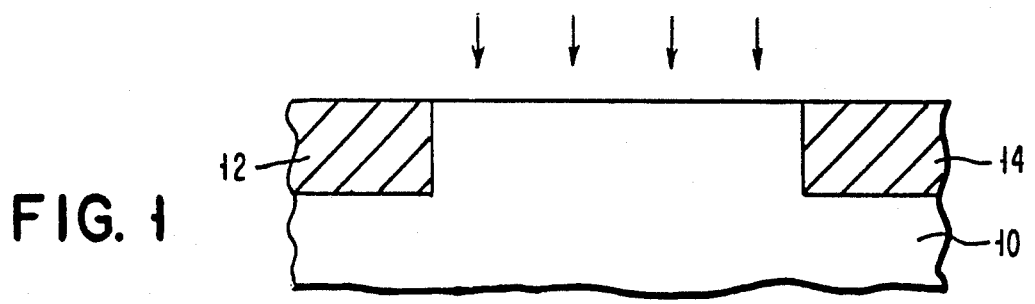
FIGS. 1, 2, 3 and 4 are schematic illustrations of a cross-section of a structure during the process of fabrication of a EEPROM memory cell according to the principles of the present invention.
Figure 2:
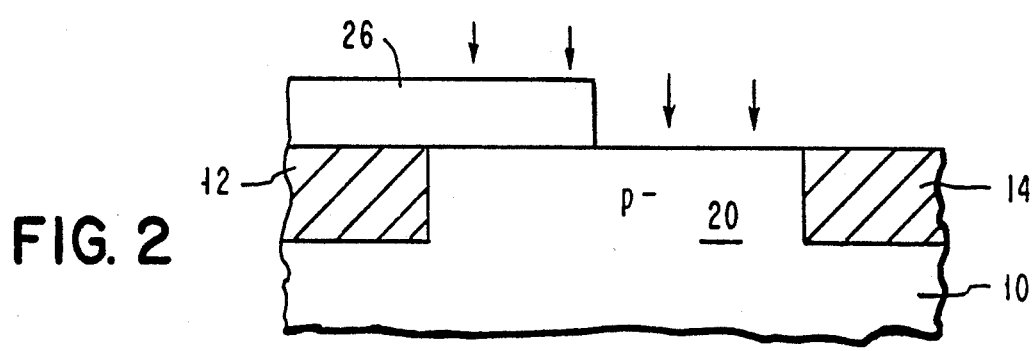

Referring to FIG. 1, a silicon substrate 10 is shown including the isolation regions 12 and 14. A channel implant is performed in the region 20 using, for example, a p-type dopant such as boron at a relatively low dosage. In FIG. 2, the channel region 20 is then selectively implanted with a higher dosage of boron using an implant mask 26 over the region which is to remain at the lower dosage.

Figure 3:
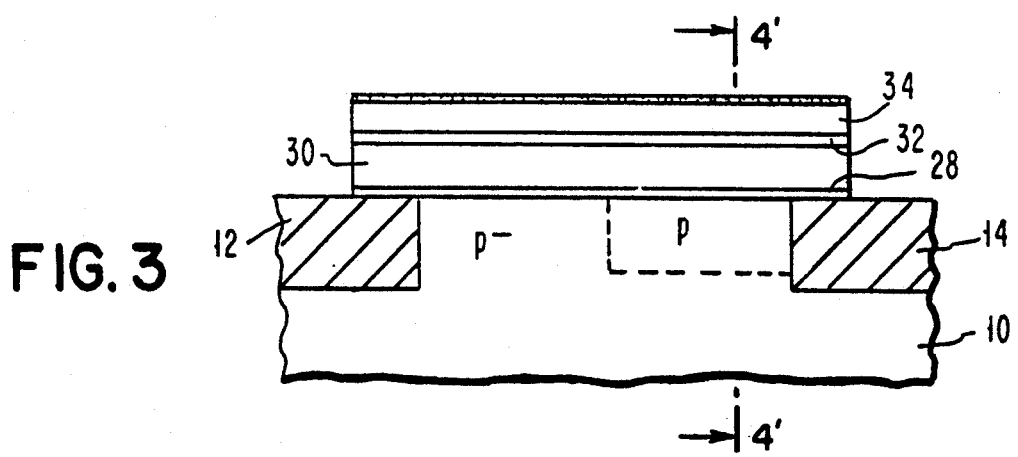

In FIG. 3, the mask 26 is removed and a layer of thermal oxide ($S_iO_2$ layer 28) is grown over the implanted channel region 20. A layer 30 of polysilicon is deposited on the oxide layer 28 which will be used to form a floating gate. A thin insulation layer 32 is formed on top of polysilicon layer 30. Insulation layer 32 could be formed by oxidizing a deposited composite layer of silicon dioxide/silicon nitride, resulting in a oxide/nitride/oxide (ONO) composite. A second layer 34 of polysilicon is formed over layer 32 which will be used for the control gate. A cross-section 4'—4' is taken through the structure of FIG. 3 as shown and is illustrated in FIG. 4. In FIG. 4, the portion of the channel length presented to the viewer is the heavily doped channel region. The polysilicon and oxide layers of FIG. 3 are fabricated into the floating gate 22 and control gate 24 of FIG. 4 by conventional self-aligned patterning and reoxidation steps. The source region 16 and drain region 18 are ion-implanted as well as the control gate 24. Thereafter, the sidewalls 36 and 38 are formed by conventional techniques and a conventional CMOS device fabrication process is continued to provide the finished device.

Figure 5:
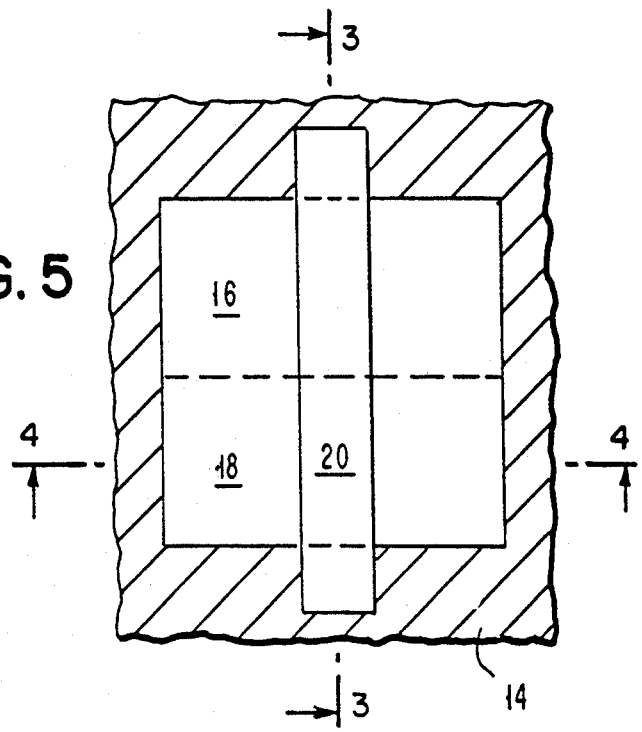
FIG. 5 is a schematic illustration of a top view of the EEPROM memory cell illustrated in FIG. 4.

FIG. 5 shows a top view of FIG. 4 with the ONO layer 32, floating gate 22 and control gate 24 not shown so that the channel region 20 with higher and lower doped regions can be illustrated more clearly.

The present invention is not limited to the EEPROM embodiment shown in FIGS. 4 and 5 wherein the control gate 24 is directly over the floating gate 22.

Figure 6:
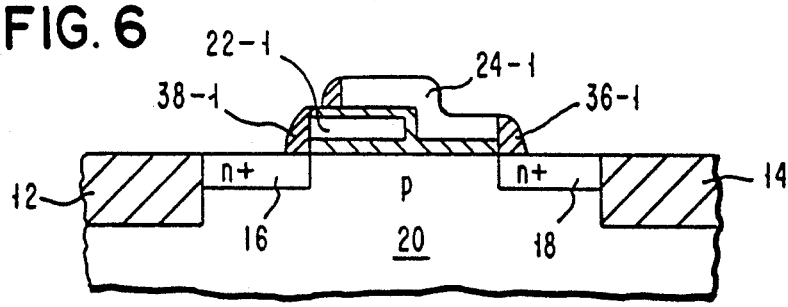
FIG. 6 is a schematic illustration of a cross-section of an embodiment of an EEPROM memory cell according to the principles of the present invention.

In FIG. 6, a cross-section of EEPROM cell is illustrated wherein most of the device elements are the same as shown in FIG. 4 and have the same reference numbers assigned thereto with the exception of floating gate 22-1 and control gate 24-1.

Figure 7:
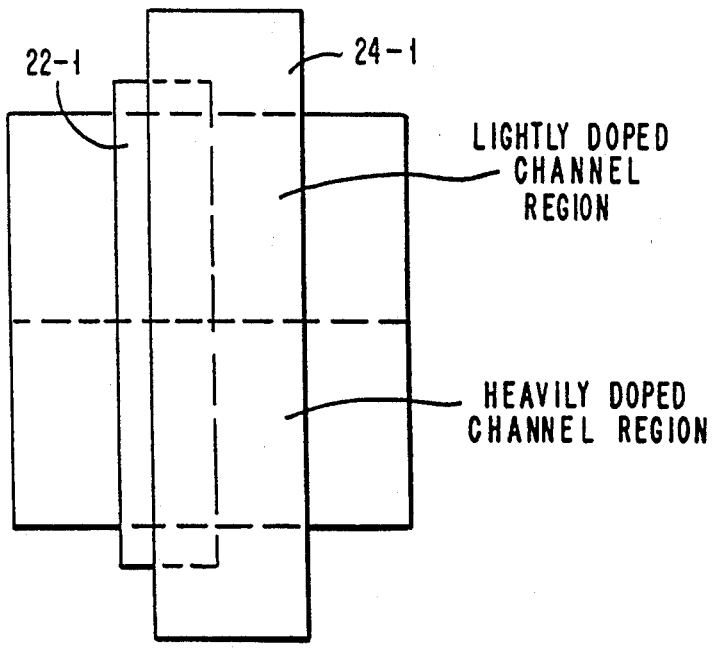
FIG. 7 is a schematic illustration of a top view of the EEPROM memory cell illustrated in FIG. 6.

Control gate 24-1 is disposed only partially over the floating gate 22-1. The channel implant in the structure shown in FIG. 6 is the same as shown in the embodiment of FIGS. 4 and 5. Referring to FIG. 7, the top view illustrates that selective heavily doped and low doped regions are provided along the channel width direction of the channel region beneath floating gate 22-1.

What has been described are two embodiments of improved electrically programmable and electrically erasable memory cells including channel regions selectively implanted along the channel width with high and low doped regions.

Having thus described our invention, what we claim as new and desire to secure by Letters Patent is:

1. A method for fabricating a semiconductor memory cell comprising the steps of:
   Step 1. forming isolation trenches in a silicon substrate,
   Step 2. implanting first type dopants into the channel region of said substrate surface between said isolation trenches with a relatively low dosage,
   Step 3. masking a portion of said channel region of said substrate surface between said isolation trenches,
   Step 4. implanting second type dopants into the unmasked portions of said channel region of said substrate surface with a relatively high dosage, to provide a channel region having a low doped region and a high doped region,
   Step 5. removing said mask from over said channel region and forming a floating gate element on said substrate surface over said low doped and high doped channel regions,
   Step 6. forming a control gate region over said floating gate region.

2. A method according to claim 1 further including:
   Step 7. forming source and drain regions in said substrate on either side of said channel region.

3. A method according to claim 2 wherein said dopant implanted in Step 2 is boron implanted with relatively low dosage.

4. A method according to claim 2 wherein said dopant implanted in step 4 is boron implanted with relatively high dosage.

5. A method according to claim 2 where said Step 5 includes the steps of:
   5A. growing a layer of thermal oxide over said doped channel region,
   5B. depositing a layer of polysilicon on said layer of thermal oxide, 5C. forming a layer of insulation material on said polysilicon layer.

6. A method according to claim 5 wherein said Step 6 includes the steps of:

6A. forming a layer of polysilicon over said layer of insulation of step 5C, said polysilicon layer of Step 5B providing a floating gate and said polysilicon layer of Step 6A providing a control gate.

7. A method according to claim 6 wherein said polysilicon layer control gate element is disposed entirely over said polysilicon layer floating gate element.

8. A method according to claim 6 wherein said polysilicon layer control gate element is disposed partially over said polysilicon layer floating gate element.

9. An EEPROM memory cell structure comprising:
a silicon substrate having first and second shallow trench isolation regions disposed therein and spaced apart a selected distance,
a channel region in said substrate and located between said isolation regions and disposed in the central portion of said selected distance, said channel region having a high doped side and a low doped side along the width of the channel,
a floating gate element disposed over said high and low doped channel region,
a control gate element disposed over said floating gate region,
a source element disposed in said substrate between said channel region and said first one of said isolation trenches; and
a drain element disposed in said substrate between said channel region and said second one of said isolation trenches.

10. An EEPROM memory cell according to claim 9 wherein said control gate is disposed entirely over said floating gate.

11. An EEPROM memory cell according to claim 9 wherein said control gate is disposed partially over said floating gate.

12. An EEPROM memory cell according to claim 9 wherein said channel region is highly doped in one portion with boron and lightly doped in another portion with boron.

* * * * *